United States Patent [19]

Heinz

[11] Patent Number: 4,775,815

[45] Date of Patent: Oct. 4, 1988

[54] SHEAR MOTOR FOR DYNAMIC MOUNT FOR LASER-BEAM STEERING MIRROR

[75] Inventor: Theodore A. Heinz, Simi Valley, Calif.

[73] Assignee: Rockwell International Corporation, El Segundo, Calif.

[21] Appl. No.: 610,461

[22] Filed: May 15, 1984

[51] Int. Cl.⁴ .................... H01L 41/04; G02B 27/17
[52] U.S. Cl. .................... 310/328; 310/333; 350/487; 372/107
[58] Field of Search .......... 350/486, 487, 611; 372/107; 310/328

[56] References Cited

U.S. PATENT DOCUMENTS

| | | | |
|---|---|---|---|
| 3,758,199 | 9/1973 | Thaxter | 350/487 |
| 3,902,783 | 9/1975 | Badlay | 350/487 |
| 3,957,356 | 5/1976 | Pledger | 350/611 |
| 3,981,566 | 9/1976 | Frank et al. | 350/487 |
| 4,060,314 | 11/1977 | Heinz | 350/487 |
| 4,203,654 | 5/1980 | Ellis | 350/487 |
| 4,406,525 | 9/1983 | Itoh et al. | 350/486 |
| 4,577,131 | 3/1986 | Soobitsky | 350/487 |

FOREIGN PATENT DOCUMENTS 1578046  7/1969  France .................... 350/486

OTHER PUBLICATIONS

Albertinetti et al., "Discrete Actuator Deformable Mirror", 4/20/79, SPIE, vol. 179, Adapt. Opt. Comp. II.

Primary Examiner—Nelson Moskowitz
Attorney, Agent, or Firm—H. Fredrick Hamann; Harry B. Field; David C. Faulkner

[57] ABSTRACT

A dynamic mount and actuator for a laser mirror 20 comprising three piezoelectric motors 40 mounted 120° apart on a motor-mount member 32. Each motor 40 comprises a rectangular block 44 composed of horizontal layers of electroded piezoelectric wafers 46, adjacent layers being bonded together. The one-axis movements of each shear motor 40 are amplified by and transmitted to an axially extending flex-joint assembly 36 which is formed with two universal-type flex joints 102, 104 therein.

12 Claims, 8 Drawing Sheets

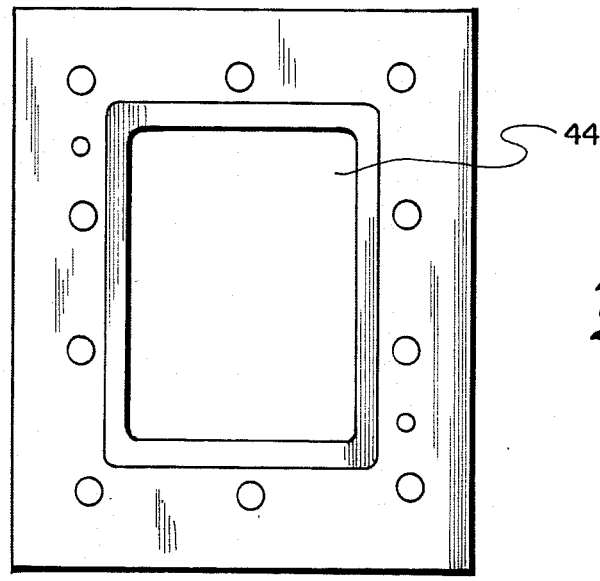
Fig.3.
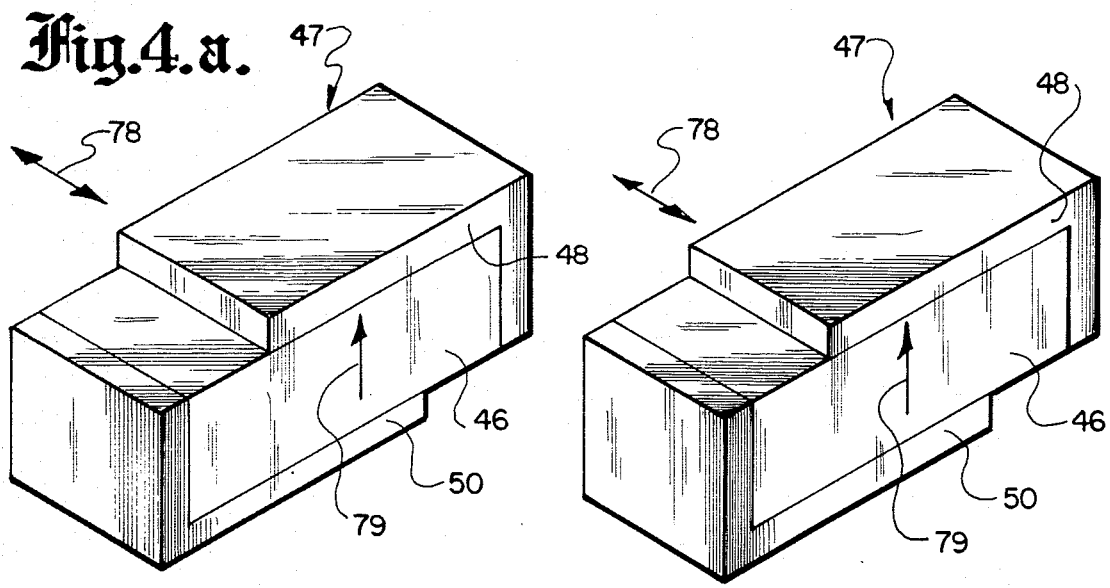
Fig.4.a.
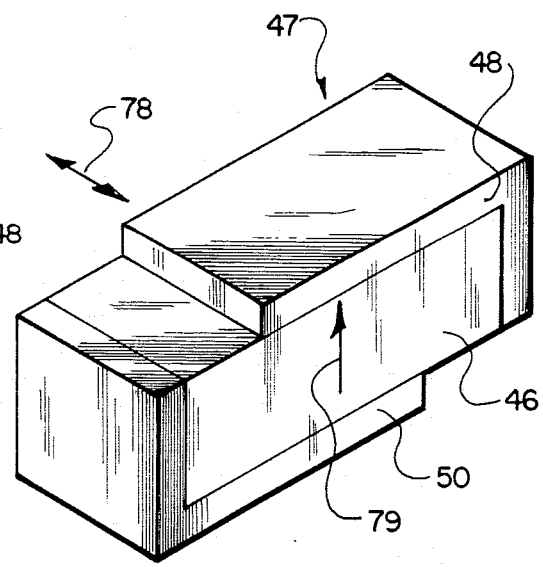
Fig.4.c.
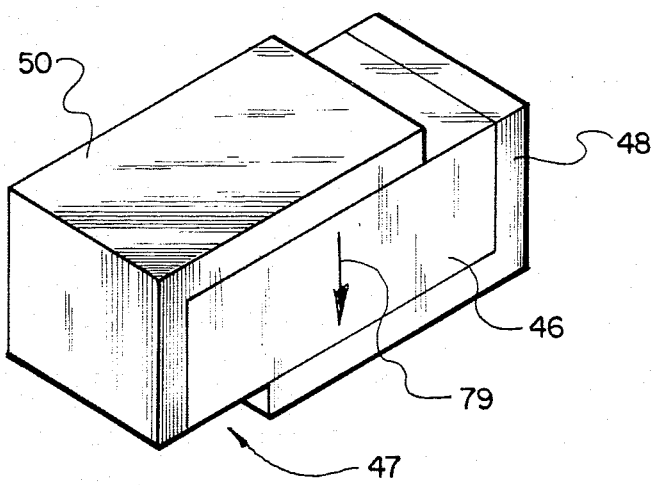
Fig.4.b.

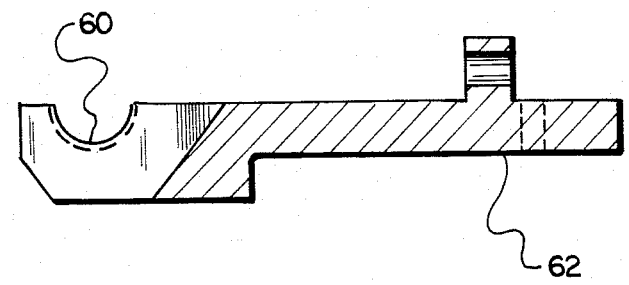
Fig. 5.a.
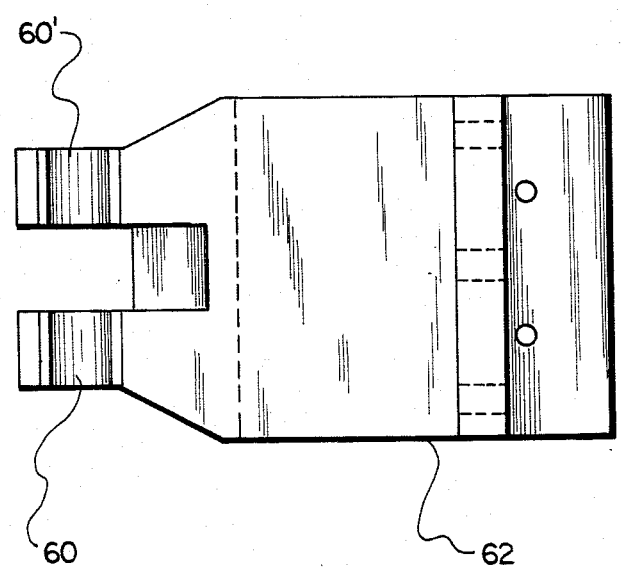
Fig. 5.b.

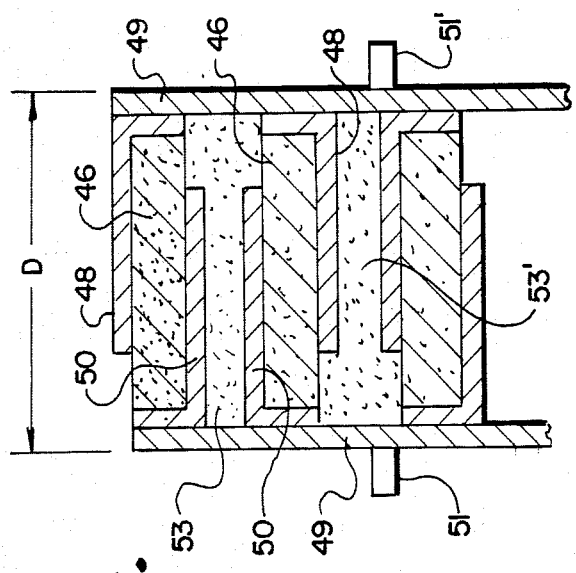
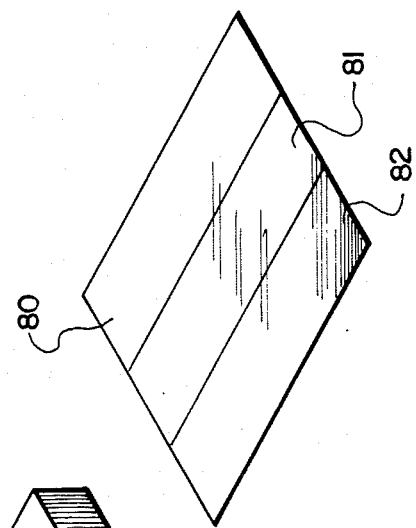
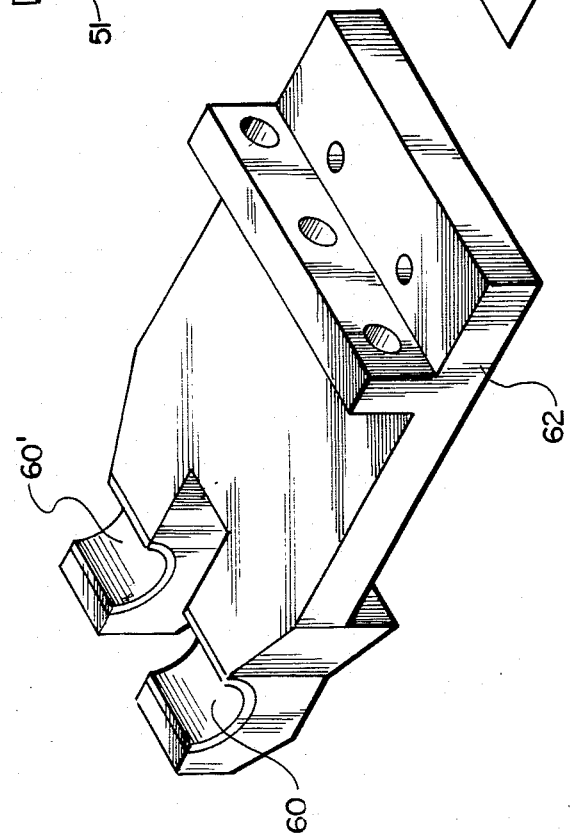
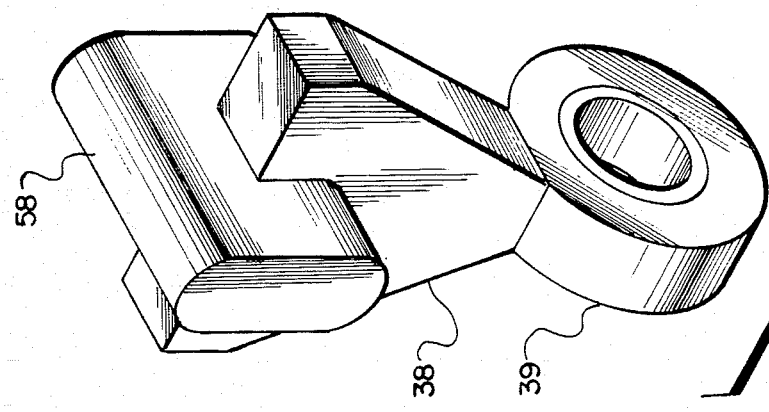

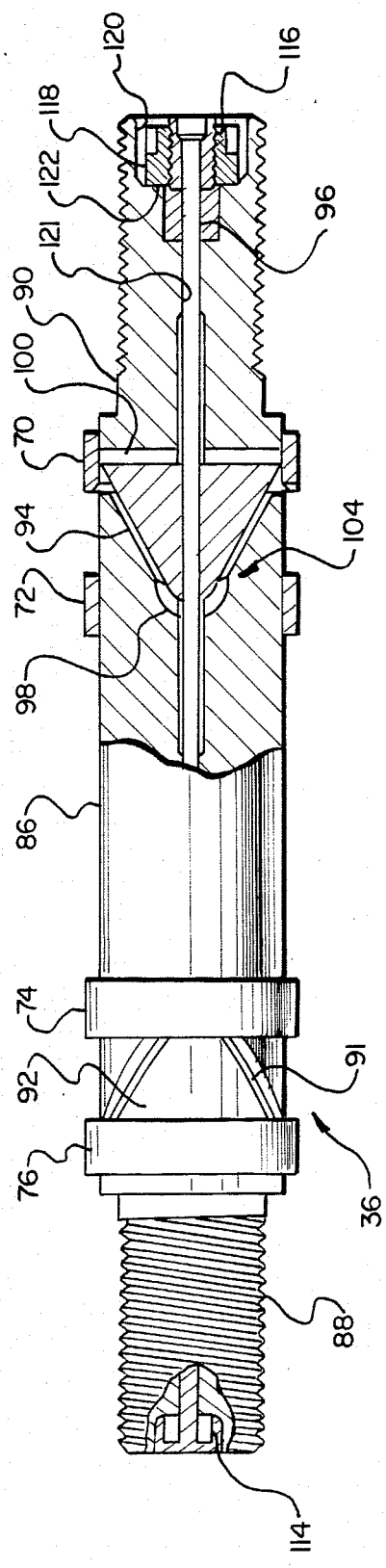
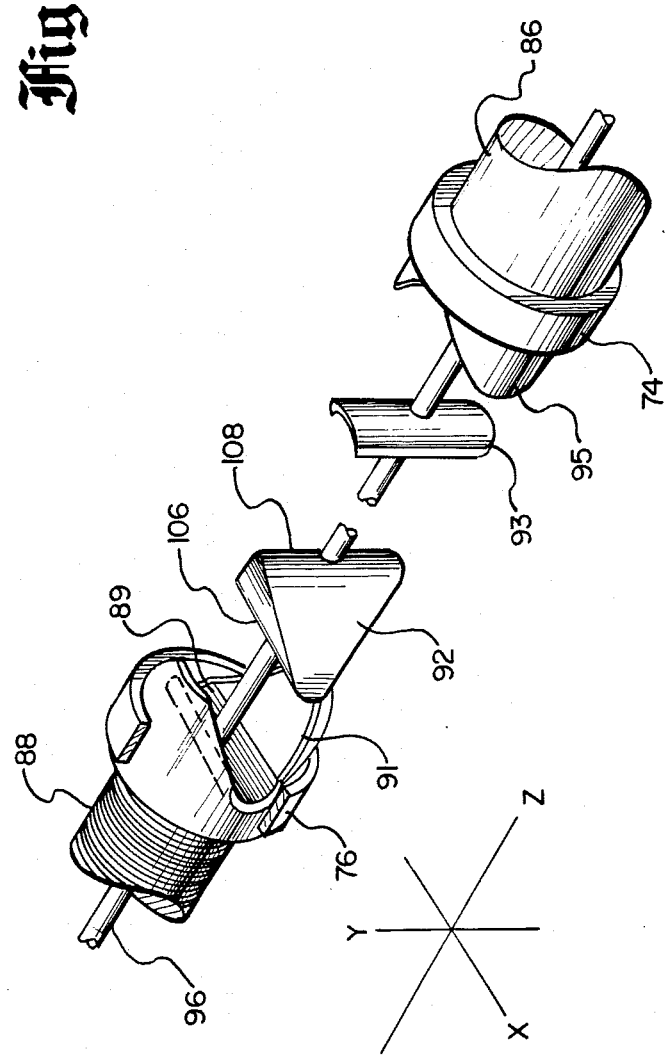
Fig. 8.
Fig. 9.

SHEAR MOTOR FOR DYNAMIC MOUNT FOR LASER-BEAM STEERING MIRROR

BACKGROUND OF THE INVENTION

1. Field of the Invention

This invention relates to a high-performance, reactionless, dynamic mount for a laser-beam steering mirror and especially to a motor for actuating a mirror supported by such a mount.

2. Description of the Prior Art

High-energy laser (HEL) systems generally employ an adjustable, cooled mirror to steer the laser beam. The mirrors are large and heavy, and beam control requires precise pointing, focusing and stabilization of the beam in a severely vibrational environment. To date, a mirror mounting-and-moving device capable of satisfactorily performing these control functions has not been demonstrated even though extensive effort has been expended thereon.

Perturbations arising from acoustic, thermal and maneuvering loads in the mirror, its mount and its dynamic actuator require the actuator (or motor) to be capable of providing several milliradians of stroke and to have an operating bandwidth from D.C. to several kilohertz (KHz). Stroke precision is on the order of a few microradians. The high intensity of the beam on the mirror surface and the low allowable distortion of the mirror surface combine with high dynamic loads to increase mirror size and weight (in excess of 30 lbs.).

Mounting a HEL in an aircraft or a space satellite places a premium on drive power component weight. Large values of actuator heat dissipation in the mirror dynamic mount contribute to thermal distortion and complicate thermal management. Additionally, it is desirable to minimize disturbances in the supporting optics structure, arising from the large reaction forces in the dynamic devices.

Actuators formed from stacks of piezoceramic wafers have been used for some time to control the surface orientation of laser mirrors or as dynamic drivers for small mirrors and elements of mirror arrays. These actuators utilize strains imposed by an electric field in the direction of thickness ($d_{33}$ direction) or length ($d_{31}$ direction). Actuators of this type are limited to 200-300 microinches of movement per inch of their length even if operated at a high voltage (e.g., 30-50 volts/0.001 inch of wafer thickness).

In an operating system, the dynamic mirror mount actuators are driven be a "closed loop", electronic servo system. Error signals may be obtained from a variety of optical sensor arrangements depending upon specific system considerations. In all cases, however, stability of a practical servo drive requires that structural resonances of the actuator drive train be higher than operating frequencies. Control of heavy heat exchanger-type mirrors (cooled mirrors) at several kilohertz requires actuator spring rates of tens of millions of pounds per inch of deflection.

Piezoceramic actuators appear basically as pure capacitive loads to the driving amplifier. As a consequence, almost all of the driving power is dissipated in the output stage of the amplifier. This is an advantage in thermal management of the actuators but places heavy burdens on amplifier design. The quantity of driver-dissipated, or "reactive power", is a function of the square of the driver output voltage for a given operating frequency. Reactive power also increases in proportion to frequency. For example, if an actuator requires 100 volts to achieve a required displacement at a frequency of 300 Hz, and this corresponds to a reactive power of 200 watts, the reactive power would increase to 20,000 watts if the required voltage were 1000 volts. Thus, lower operating voltages are desirable for piezoceramic actuating motors.

As described, the conventional piezoceramic actuator requires excessive length to achieve required deflections, the resultant structural proportions resulting in excessively low resonance characteristics. Practical power considerations preclude high-frequency operation at high voltage. The unique piezoceramic shear motor used in the present invention provides a displacement per volt which is six times as much as that provided by a conventional PZT actuator. The block-like proportions are ideally suited to high structural resonance design. Also, the configuration used is inherently reactionless.

OBJECTS OF THE INVENTION

An object of the invention is to provide an inherently reactionless dynamic mount for a HEL laser, beam-steering mirror, Another object is to provide a high-performance mount for a HEL, beam-steering mirror.

A further object is to increase the deflection per volt provided by piezoceramic actuators.

Yet another object is to provide a piezoelectric actuator having a high structural resonance frequency.

Other objects, advantages and novel features of the present invention will become apparent from the following detailed description of the invention when considered in conjunction with the accompanying drawings.

SUMMARY OF THE INVENTION

The objects and advantages of the present invention are attained by a dynamic mount-and-actuator assembly for objects such as laser mirrors. The actuator is a novel piezoelectric shear motor three of which are mounted in a holding means 120° apart with respect to a central axis.

The axial movements of each shear motor are transferred to an axially extending, novel, stiff linkage, or flex-joint assembly, by a lever arm, or vertical strut. The linkage transfers a movements to the mirror through the support member and suspension plate.

BRIEF DESCRIPTION OF THE FIGURES

FIG. 3 is a cross-sectional view of a shear motor taken along line A—A in FIG. 1.

FIGS. 4A, 4B and 4C are isometric views of three adjacent piezoelectric elements of shear motor. FIGS. 4A and 4B show adjacent vertical elements and FIGS. 4A and 4C show adjacent horizontal elements.

FIGS. 5A and 5B are a side and top view of the actuator loading plate.

FIG. 5C is an isometric exploded view of the vertical strut, trunnion member and actuator loading plate.

FIG. 6 is a side view of several shear elements showing the electrode arrangement and the arrangement of the electrical contact with the electrodes on the shear elements.

FIG. 7 is a schematic illustration of the manner in which three layers of shear elements would move in response to an applied voltage.

FIG. 8 is a partially broken away side view of the linkage, or flex-joint assembly.

FIG. 9 is an isometric exploded view of the front flex-joint.

The same elements or parts through the figures of the drawings are designated by the same reference characters, while equivalent elements bear a prime designation.

DETAILED DESCRIPTION OF THE INVENTION

Figure 1:
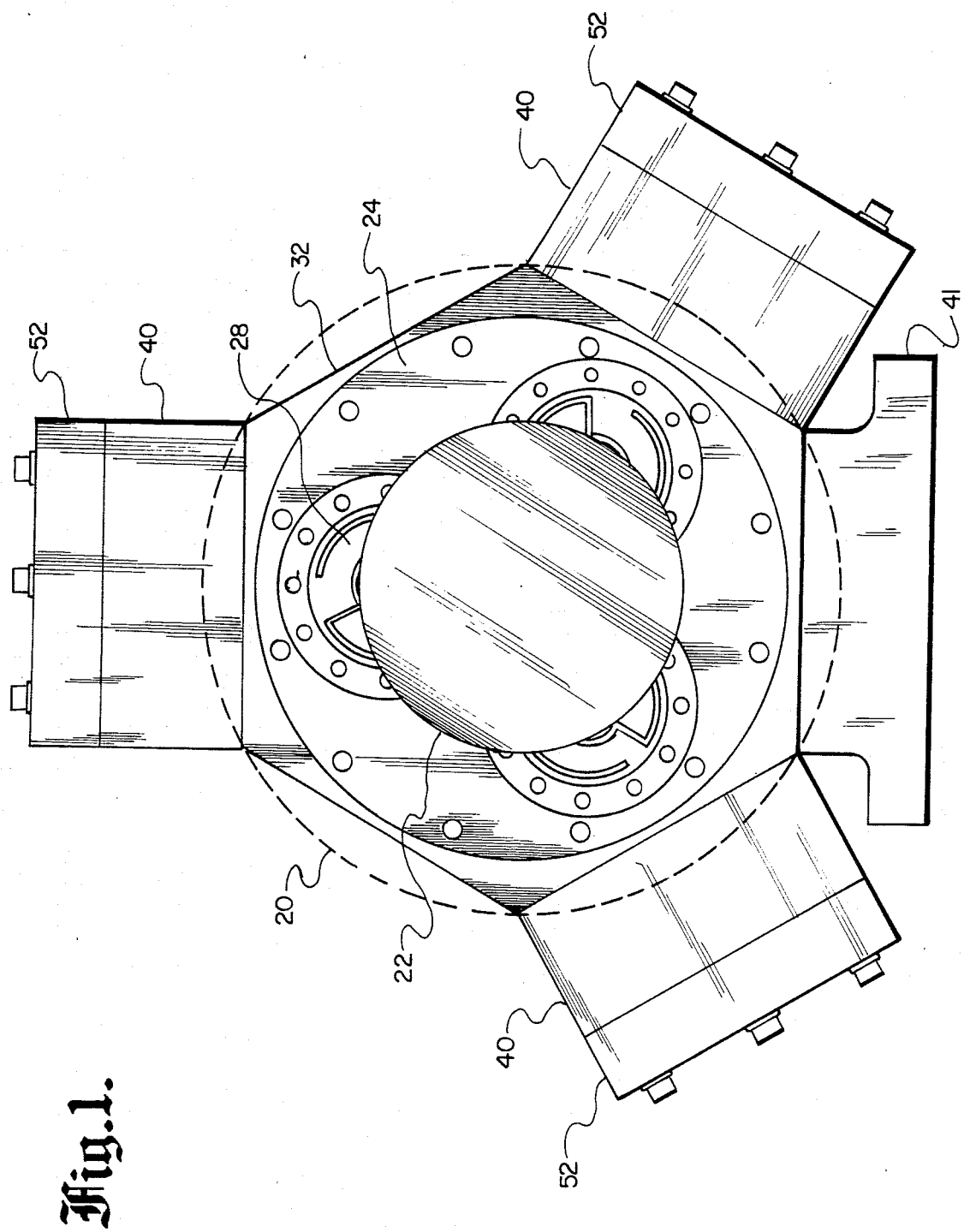
FIG. 1 is a front view of a dynamic mirror actuation assembly in accordance with the invention.
Figure 2:
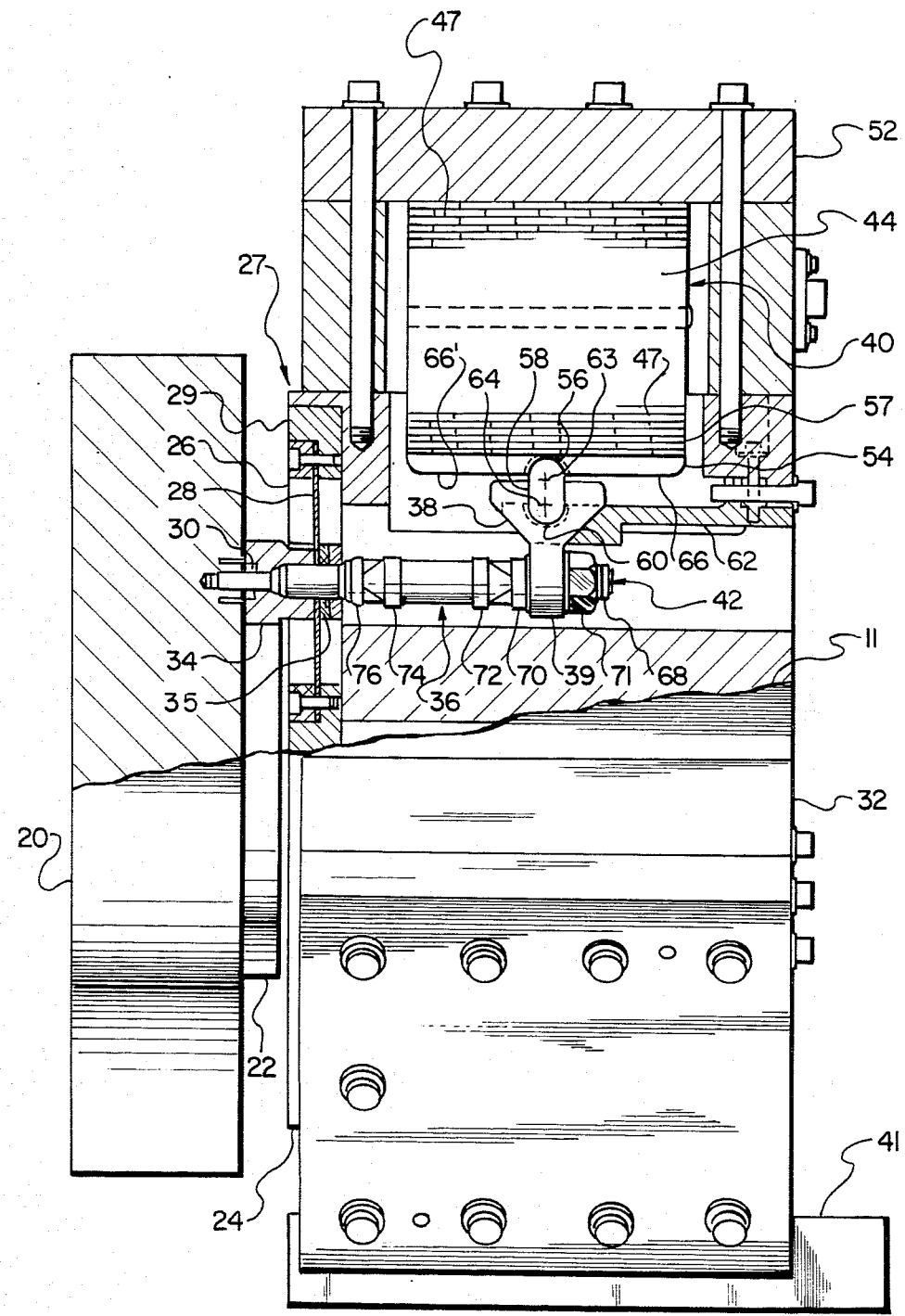
FIG. 2 is a side view of the assembly shown in FIG. 1.

A front view of a dynamic mirror actuation assembly in accordance with this invention is shown in FIG. 1 and a side view in FIG. 2. The inventor has filed a copending U.S. patent application for a "High-Performance Dynamic Mount for a Laser-Beam Steering Mirror" which is incorporated herein by reference. A laser mirror 20 is mounted on a mirror backing plate 22, or support plate, by means of three interface pins 30 which are embedded near the outer edge of the mirror 20 at 120° intervals. The pins 30 project from horizontal support members 34 and are designed so that they do not distort the mirror 20. Three shear motors 40 are mounted at 120° intervals around a motor-mount member 32 to the front of which is attached a suspension plate 24. The suspension plate 24 carries three suspension assemblies 27 at 120° intervals, each of which encircles a support member 34 which holds one end of an interface pin 30 and one end of a horizontal force-transmission linkage, or flex-joint assembly, 36. The other end of the flex-joint assembly 36 is coupled to the lower end of a strut 38 which is part of a vertical strut assembly 42. Axially directed (referring to the longitudinal axis of the flex-joint assembly 36) forces from a shear motor 40 are transmitted through the lever-like action of the vertical strut assembly 42 to an associated flex-joint assembly 36, and thence through the support member 34 and mirror backing plate 22 to the mirror 20.

A mirror backing plate 22 is affixed to the rear of the mirror 30 and a suspension plate 24 is affixed to the motor mount 32. Three suspension assemblies 27 are integrally formed as part of the suspension plate 24 at 120° intervals around the outer portion of the plate 24. Each suspension assembly 27 comprises an outer suspension ring holder 29, preferably annular, and a flexure assembly 28, preferably annular, which fits inside a recess in the suspension ring holder 29. A roughly cylindrical support member 34 extends between the center of the suspension assembly 27 and the mirror backing plate 22, to which it is attached by an interface pin 30. The support member 34 is formed in two parts which are pinned to each other but are separated by a flexure assembly 28 which also is placed between the suspension ring 26 and the suspension ring holder 29 so that relative movement with six degrees of freedom is possible between the mirror 20 and the suspension plate 24. The mirror mount thus permits axial deflections and tip and tilt movements at each suspension assembly.

A shear motor 40 (see FIG. 2) comprises a shear blcok 44 consisting, for example, of 379 piezoelectric rectangular wafers, or strips, 46, each of which is 3" deep, 0.050" thick and ⅜" wide. These are put together to form 60 layers in a 3×4×3" block, the top and bottom layers being insulated. Each strip 46 is polarized (direction of arrow 78 in FIG. 4) during manufacture so that application of a voltage across the strip 46 produces a shear strain 78 across its width when the voltage is applied perpendicular to the shear planes. The top of ths strip 46 is plated with an electrode 48 which folds around one end (the rear in FIG. 4A) and does not extend completely to the front end. The bottom of the strip 46 is plated with another electrode 50 which folds around the front end of the strip 46 and does not extend completely to the rear end.

Vertically adjacent strips 46 are arranged in a staggered fashion as shown in FIG. 2 so that the shear motion of adjacent strips occurs in the same direction. Adjacent horizontal strips 46 are arranged as shown in FIGS. 4A and 4C so that the shear motion of these strips also occurs in the same direction. The direction of the applied voltage (i.e., the direction of an arrow 79 indicating the direction of applied voltage) of strips 46 in the same horizontal layer is the same; but the direction of the applied voltage arrows in strips 46 in adjacent horizontal layers is opposite. One shear element 46 defines the width of the motor 40 (depth D as shown in FIG. 6) i.e. one shear element but a plurality of elememts are arranged horizontally to form horizontal layers, as shown in FIG. 2. The elements are insulated from each other vertically by insulative adhesive bonding material 53,53'.

The layers are bonded together; therefore, the total extent of movement is cumulative.

A fine-woven wire mesh 49, 49' (see FIG. 6) is affixed to the electrode platings, one on each side, by a suitable conductive adhesive, such as a conductive resin (not shown). Each mesh may be fabricated as a double layer, if desired, for reliability. A conductive terminal 51, 51' is affixed to each wire mesh for connection to a source of control voltage, such as a closed-loop electronic servo system. Test data has shown that the deflection per volt for this configuration is approximately 6 times that of a conventional PZT stack of the same length and strip element thickness.

The shear block 44 is supported in a frame 52 and rests upon a bottom plate 54 which is formed with an indentation in which a Vespel trunnion bearing 56 is placed. Actuation forces are transmitted into the vertical strut assembly 42 through a trunnion member 58 which has rounded ends which fit into the upper Vespel trunnion bearing 56 and a lower Vespel trunnion bearing 60 in an actuator loading plate 62. The trunnion member 58 pivots about an imaginary pivot point 64 (as seen in FIG. 2). The center of curvature 63 of the upper Vespel trunnion bearing 56 provides another immaginary point on the trunnion member, as seen in FIG. 2. The distance between the center of curvature 63 and the pivot point 64 is ⅓ the distance between the pivot point 64 and the center line of the horizontal strut 36, thus providing a 3:1 mechanical amplification at the horizontal strut 36. That is, a deflection generated by the shear motor 40 is magnified three times at the horizontal strut 36 which applies the amplified displacement to the mirror 20.

A top view of the actuator loading plate 62 is shown in FIG. 5B. It can be seen that the plate 62 has two Vespel bearings 60 and 60', one on either side of the vertical strut 38 for movably supporting the ends of the trunnion member 58. FIG. 5A shows a side view of the actuator bearing plate 62, as also shown in FIG. 2. FIG. 5C shows in an isometric exploded view vertical strut 38, the oval-cross-section bar constituting the trunnion member 58 and the actuator loading plate 62 with its Vespel bearings 60,60' which contact the ends of the trunnion members 58. The trunnion member 58 is affixed, e.g., by brazing, to the vertical strut 38 at their area of contact.

The actuator loading plate 62 which contains the lower pivot bearings 60,60'(see FIGS. 5A, 5B and 5C) also provides a 400 lb. compressive force for the shear block 44 and trunnion bearings. Tests have shown this preload to be an important factor in reducing shear block creep and hysteresis. The preload is obtained by proper sizing of the actuator-loading-plate spring rate and assembly clearances.

If a horizontal plane is passed through the pivot point 64 (as viewed in FIG. 2), then during operation of the shear motor, the motion of all components above the plane is opposite in direction to that of all components below the plane. If the component weights are not properly balanced, reaction moments may exist and it may be necessary to add trimming weights. One such is shown as a weight 68 threaded on the rear of the flex-joint assembly 36. Others may be attached to the bottom of the loading plate 54, if necessary, at points 66, 66', for example.

A threaded attachment rigidly joins the lower end of the vertical strut 38 with the horizontal strut, or flex-joint assembly, 36. The lower end 39 of the vertical strut 38 is positioned and kept in place by being clamped between a retaining ring 70 and a nut 71. Horizontal movements to the left (or right) of the bottom plate 54 of the shear block move the flex-joint assembly 36 to the right (or left) through transfer by the vertical strut assembly 42.

The horizontal strut assembly 36 comprises a central shaft 86, FIG. 8, and two outer shafts, the forward shaft and the rear shaft 88 and 90. The shafts are coupled at one end with trunnion blocks 92, 94 which fit into associated trunnion bearings, the front joint bearings 89 and 93, and the rear joint bearings 89 and 100, respectively. Each block 92,94 is in the form of a double wedge which together with its bearing forms what may be called a flex joint, there being a forward flex joint 102 and a rear flex joint 104. Each flex joint is capable of movement in two degrees of freedom along orthogonal axes. Both joints move along the same set of axes.

FIG. 9 shows an isometric exploded view of the front flex joint, providing a better understanding of the shape and action of the joint. A front, or horizontal, semi-cylindrical, Vespel bearing 89 fits into the semi-cylindrical apex of a front, or horizontal, trunnion block receiver 91 which has triangular, flaring sides and forms into the rear end of the front shaft 88. The front, or horizontal, edge of the trunnion block 92 fits into the receiver 91 and Vespel bearing 89. Behind the block 92, there is a rear, or vertical, Vespel bearing 93, which fits into a rear, or vertical, trunnion block receiver 95 which is oriented in a 90° rotation from the orientation of the horizontal receiver 91 and forms into the front end of the central shaft 86. If a set of orthogonal axes labelled X and Y is orthogonal to the axis z through the wire 96 running centrally through the flex-joint assembly, then the front edge 106 of the trunnion block 92 rotates around the X axis and the rear edge 108 rotates around the Y axis and the block 92 can move with two degrees of freedom in the X-Y plane.

The assembly 36 is held together by two sets of spaced retaining rings and a stressed interval wire 96, e.g., a piece of 1/16 inch piano wire. The first set of retaining rings has one 76 which is pressed around the front shaft 88 over the area where the front 106 of the block 92 meets the Vespel bearing 89. The second ring 74 is pressed over the central shaft 86 where the front trunnion block 92 contacts the Vespel bearing 93. The rear retaining rings 72 and 70 have the same spatial relationships with the rear flex joint 104 and the shafts 86 and 90. The retaining rings maintain lateral alignment of the flex-joint assembly components.

The flex joints are preloaded to several hundred pounds, e.g., 400 lbs., by a high-strength, resilient wire 96, e.g., a piano wire, passing through a hole drilled along the center line of the shafts for the entire length of the flex-joint assembly 36. The wire 86 is affixed, e.g., by soldering, to threaded end components, such as ferrules 114, 116. Tension can be placed on the wire 86 by tightening a tensioning nut 118 which is threaded over the rear ferrule 116 and abuts against the rear outer shaft 90. The nut 118 and ferrule 116 are set into a recess 120 with the forward edge of the nut 118 abutting against a shoulder 122 of the shaft 90 within the recess 120. The wire 86 is fitted snugly into the passage in the center shaft 86 and the adjacent bore in each outer shaft 88 and 90 is relieved over a length required to establish the desired bending strain.

Friction is minimized by using low-friction Vespel bearing inserts at the flex joints 102, 104.

The dynamic flex joints provide the horizontal strut assembly 36 with low friction, small-angle alignment capability while maintaining an unusually stiff load path of the order of several million lbs/in., which is unusual for this type of device. This very high spring rate is necessary because this system requires a high resonance frequency. It should be noted that, in high spring rate devices, the output amplitude corresponds closely to the input amplitude.

The flexure assembly 28 is placed in the space between the suspension ring 26 and the supporting ring holder 29. It also fits between the front section of the support member 34 and a spacer 35 between the support-member sections. The flexure assembly 28 permits movement in six degrees of freedom between the suspension ring 26 and the suspension plate 24 which is fixed, the spring rate of each degree of freedom being determined as required by design. The mirror 20, of course, moves with the suspension ring 26 and, may be tipped, tilted, or moved axially.

Figure 10:
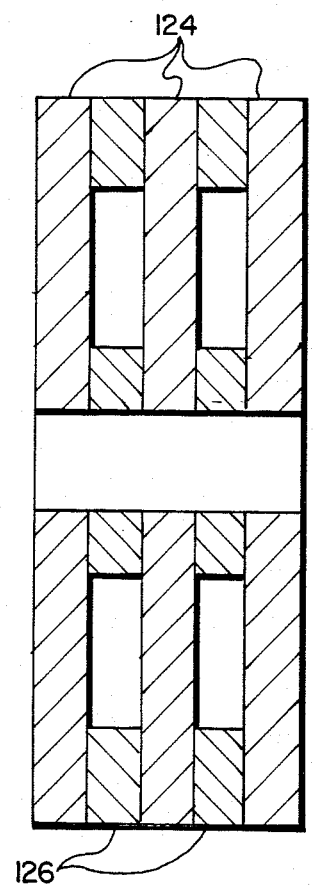
FIG. 10 is a side view of the flexure assembly.
Figure 11:
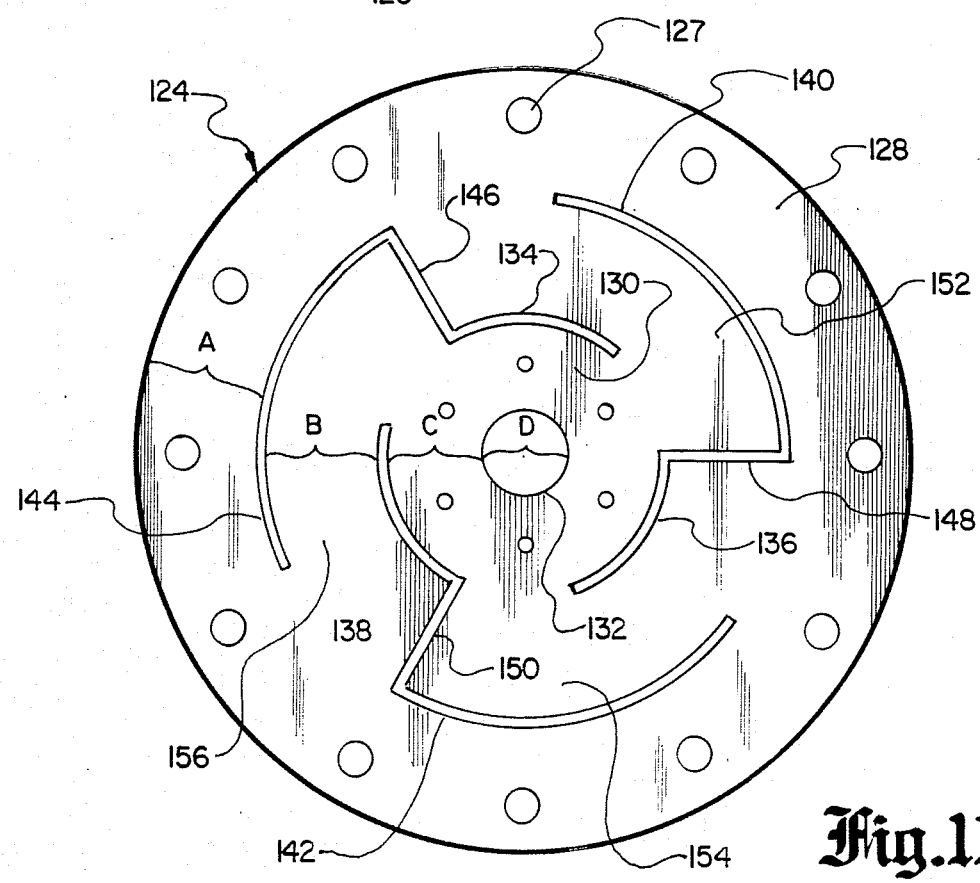
FIG. 11 is a front view of a flexible washer.
Figure 12:
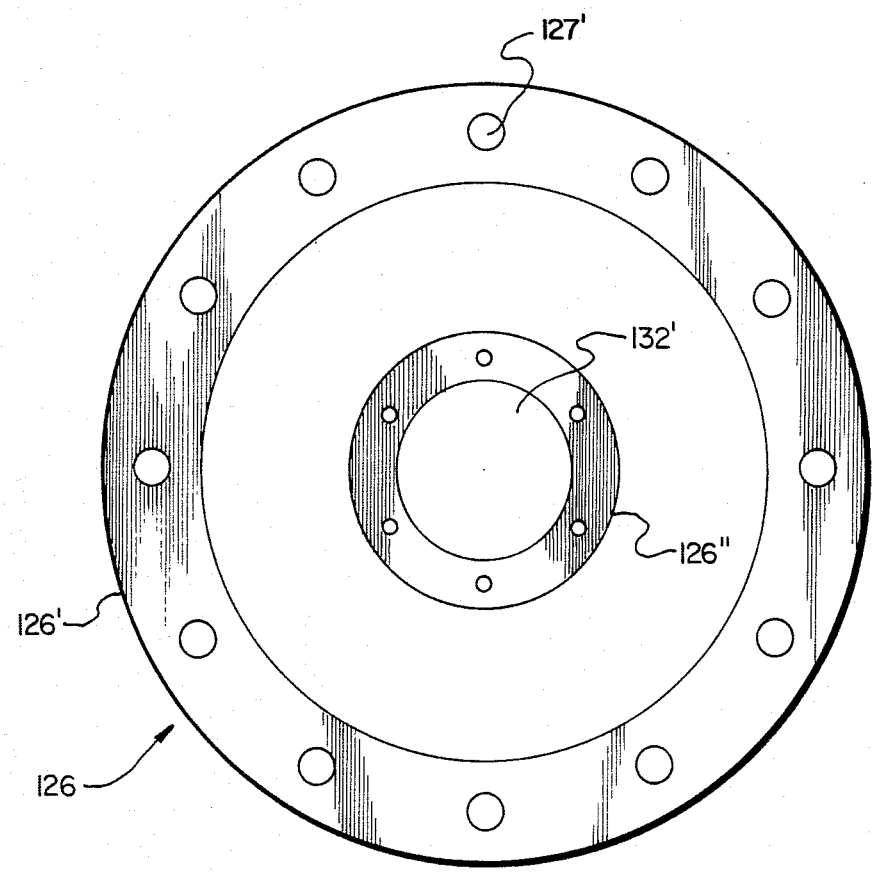
FIG. 12 is a front view of a spacer.

The flexure assembly 28, as shown in FIG. 10, comprises a set of three flexible washers 124, each adjacent pair separated by a spacer 126. Each washer, or suspension element, 124 (see FIG. 11) is a slotted circle of 0.015-inch-thick beryllium-copper spring metal. Each washer 124 comprises a peripheral, or outer, ring 128 and an inner ring 130, the inner ring 130 being defined by a central aperture 132 and a set of three inner arcuate slots 134, 136, 138 which are 0.030" inches wide in the radial direction. The outer ring 128 is defined by the periphery of the washer 124 and three outer arcuate slots 140, 142, 144. The nearest ends of the arcuate slot pairs 134 and 144, 136 and 140, 138 and 142 are connected by the short, radial slots 146, 148 and 150, respectively. The slots form beams 152, 154, 156 which are solid portions whose areas are outlined by the slots.

For example, beam 152 is within the slots 140, 148, 134 and 146. All slots have the same width.

There are two spacers 126 betwen each washer 124, each spacer being formed in two annular sections, an outer section 126' and an inner section 126". The outer section 126' is formed with equally spaced peripheral holes 127' to match those in the outer ring 128 of each washer 124. The inner spacer ring 126" is formed with a central aperturee 132' matching the central aperture 132 of each washer 128, which apertures fit around a central shoulder section of the support member 34. The spacers have the same thickness and are formed from the same spring material as the washers.

In assembly, the first and third washers are oriented so that similar slots ar aligned, the middle washer is rotated 60° with respect to the other two. A set of three washers and two spacers are employed to increase the stiffness of the flexure assembly 28 and therefore of the dynamic mirror mount. Less or more may be used as necessary. The rotation of the middle washer with respect to the other two washers also increases the uniformity of the flexure assembly 28.

The assembly 28 can be kept together in the proper orientation by passing one or more pins (not shown) through the alignment, or pin, holes 127, 127' in the washers and spacers.

Obviously, many modifications and variations of the present invention are possible in light of the above teachings. It is therefore to be understood that, within the scope of the appended claims, the invention may be practiced otherwise than as specifically described.

What is claimed and desired to be secured by Letters Patent of the United States is:

1. A piezoelectric shear motor providing actuating shear movements along an axis comprising:
    a plurality of polarized piezoelectric strips arranged in a vertical stack of horizontal layers to provide movement along a horizontal axis in response to applied electrical signals,
    adjacent horizontal layers bonded together so that the bottom surface of the upper layer moves to the same extent as the top surface of the lower layer, the movement of each horizontal layer being a shear movement along a shear plane,
    the strips being arranged so that all individual shear movements in response to a given signal produce a shear strain across the width of each strip when the electrical signal is applied perpendicular to the shear plane and the shear strain across the width the each strip occurs in the same direction along axis; and
    mechanical means affixed to the piezoelectric motor for accepting the movements and for applying them to an object.

2. A shear motor as in claim 1 wherein the mechanical means comprise a support frame and a base plate for the plurality of piezoelectric strips.

3. A shear motor as in claim 2 wherein the base plate is formed with a concavity, and the mechanical means further includes:
    lever arms means one of which fits into the concavity for movement thereby, the lever arm means being pivoted at a point such that a mechanical amplification exists at the end thereof which is opposite the end in contact with the base plate.

4. A shear motor as in claim 3 wherein the mechanical amplification is approximately 3 to 1.

5. A piezoelectric shear motor providing actuating movements along one axis comprising:
    a plurality of rectangular piezoelectric shear elements arranged side by side in horizontal layers, the layers being arranged vertically adjacent to each other to form a rectangular shear block, adjacent layers being bonded to each other so that the bottom surface of an upper layer moves to the same extent as the top surface of the lower layer to which it is bonded, the full movement of the block being the sum of the extents of movement of all individual layers,
    each shear element comprising a polarized piezoelectric strip having a first electrode in contact with the top and one end face of the strip and a second electrode in contact with the bottom and other end face of the strip, all first and second electrodes being respectively similarly located on said strips relative to the polarization of the strip, the shear elements being insulated from each other and placed together in such arrangment that all first electrodes are placed at one end of the shear block and all second electrodes are located at the other end, the movement of each strip being a shear movement;
    first electrical contact means arranged to make contact with all first electrodes at one end of the block;
    second electrical contact means arranged to make contact with all second electrodes at the other end of the block; and
    actuated means coupled to said block for movement thereby along one axis.

6. A shear motor as in claim 5, wherein:
said horizontal layers are one shear element deep.

7. A shear motor as in claim 5, wherein:
said actuated means is a bottom plate which supports said block of shear elements.

8. A shear motor as in claim 5, wherein:
said piezoelectric strips are formed from a piezoceramic material.

9. A shear motor as in claim 5, wherein:
each of said first and second electrical contact means comprise a wire mesh.

10. A shear motor as in claim 5, wherein:
said actuated means comprises a base plate affixed to said block.

11. A shear motor as in claim 6, further including:
lever arm means one end of which fits movably into said base plate for movement thereby, said lever arm means being pivoted at a point such that a mechanical advantage exists at its end which is opposite the end in contact with the base plate.

12. A shear motor as in claim 11, wherein:
said mechanical advantage is approximately 3:1.

* * * * *